(12) United States Patent
Wloka et al.

(10) Patent No.: US 8,691,168 B2
(45) Date of Patent: Apr. 8, 2014

(54) PROCESS FOR PREPARING A ZINC COMPLEX IN SOLUTION

(75) Inventors: Veronika Wloka, Mannheim (DE); Friederike Fleischhaker, Ludwigshafen (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/582,108

(22) PCT Filed: Apr. 27, 2011

(86) PCT No.: PCT/IB2011/051816
§ 371 (c)(1),
(2), (4) Date: Aug. 31, 2012

(87) PCT Pub. No.: WO2011/135514
PCT Pub. Date: Nov. 3, 2011

(65) Prior Publication Data
US 2012/0328509 A1    Dec. 27, 2012

Related U.S. Application Data

(60) Provisional application No. 61/328,658, filed on Apr. 28, 2010.

(51) Int. Cl.
*C01G 9/00*    (2006.01)
(52) U.S. Cl.
USPC ............................. 423/104; 423/387; 427/226
(58) Field of Classification Search
USPC ............... 423/104, 387; 427/226, 240, 421.1, 427/256, 430.1
See application file for complete search history.

(56) References Cited

U.S. PATENT DOCUMENTS

| 6,238,808 B1 * | 5/2001 | Arao et al. ..................... 428/629 |
| 2008/0295886 A1 | 12/2008 | Hu et al. |
| 2011/0048956 A1 | 3/2011 | Chen et al. |
| 2011/0163278 A1 | 7/2011 | Domke et al. |
| 2012/0043537 A1 | 2/2012 | Karpov et al. |
| 2012/0086002 A1 | 4/2012 | Fleischhaker et al. |

FOREIGN PATENT DOCUMENTS

| CN | 101624208 | 1/2010 |
| EP | 1 993 122 | 11/2008 |
| JP | 2003-171123 | * 6/2003 |
| JP | 2008 297168 | 12/2008 |
| WO | 2009 010142 | 1/2009 |
| WO | 2009 103286 | 8/2009 |

OTHER PUBLICATIONS

Chaudhuri, et al., "Microwave-Assisted Chemical Bath Deposition of Nanostructured ZnO Particles" J. Nanoscience and Nanotechnology, vol. 9, No. 9, pp. 5578-5585, 2009.*
Schneider, J., et al., "A Printed and Flexible Field-Effect Transistor Device with Nanoscale Zinc Oxide as Active Semiconductor Material," Advanced Materials, vol. 20, pp. 3383 to 3387, (2008).
Meyers, S., et al., "Aqueous Inorganic Inks for Low-Temperature Fabrication of ZnO TFTs," JACS Articles, vol. 130, pp. 17603 to 17609, (Dec. 3, 2008).
International Search Report Issued Nov. 24, 2011 in PCT/IB11/051816 Filed Apr. 27, 2011.

* cited by examiner

*Primary Examiner* — Steven Bos
(74) *Attorney, Agent, or Firm* — Oblon, Spivak, McClelland, Maier & Neustadt, L.L.P.

(57) ABSTRACT

The present invention provides a process for preparing a solution of electrically uncharged $[(OH)_x(NH_3)_yZn]_z$ where x, y and z are each independently 0.01 to 10, comprising at least the steps of (A) contacting ZnO and/or $Zn(OH)_2$ with ammonia in at least one solvent in order to obtain a solution of electrically uncharged $[(OH)_x(NH_3)_yZn]_z$ where x, y and z each independently 0.01 to 10 with a concentration c1, (B) removing some solvent from the solution from step (A) in order to obtain a suspension comprising $Zn(OH)_2$, (C) removing solid $Zn(OH)_2$ from the suspension from step (B), and (D) contacting the $Zn(OH)_2$ from step (C) with ammonia in at least one solvent in order to obtain a solution of electrically uncharged $[(OH)_x(NH_3)_yZn]_z$ where x, y and z are each independently 0.01 to 10 with the concentration c2, and to highly concentrated solutions of electrically uncharged $[(OH)_x(NH_3)_yZn]_z$ where x, y and z are each independently 0.01 to 10, to a process for producing a layer comprising at least zinc oxide on a substrate, comprising at least the steps of (E) preparing a solution of electrically uncharged $[(OH)x(NH3)yZn]z$ where x, y and z are each independently 0.01 to 10 by the former process according to the invention, (F) applying the solution from step (E) to the substrate and (G) thermally treating the substrate from step (F) at a temperature of 20 to 450° C. in order to convert electrically uncharged $[(OH)_x(NH_3)_yZn]_z$ where x, y and z are each independently 0.01 to 10 to zinc oxide.

20 Claims, 2 Drawing Sheets

PROCESS FOR PREPARING A ZINC COMPLEX IN SOLUTION

Figure 1:
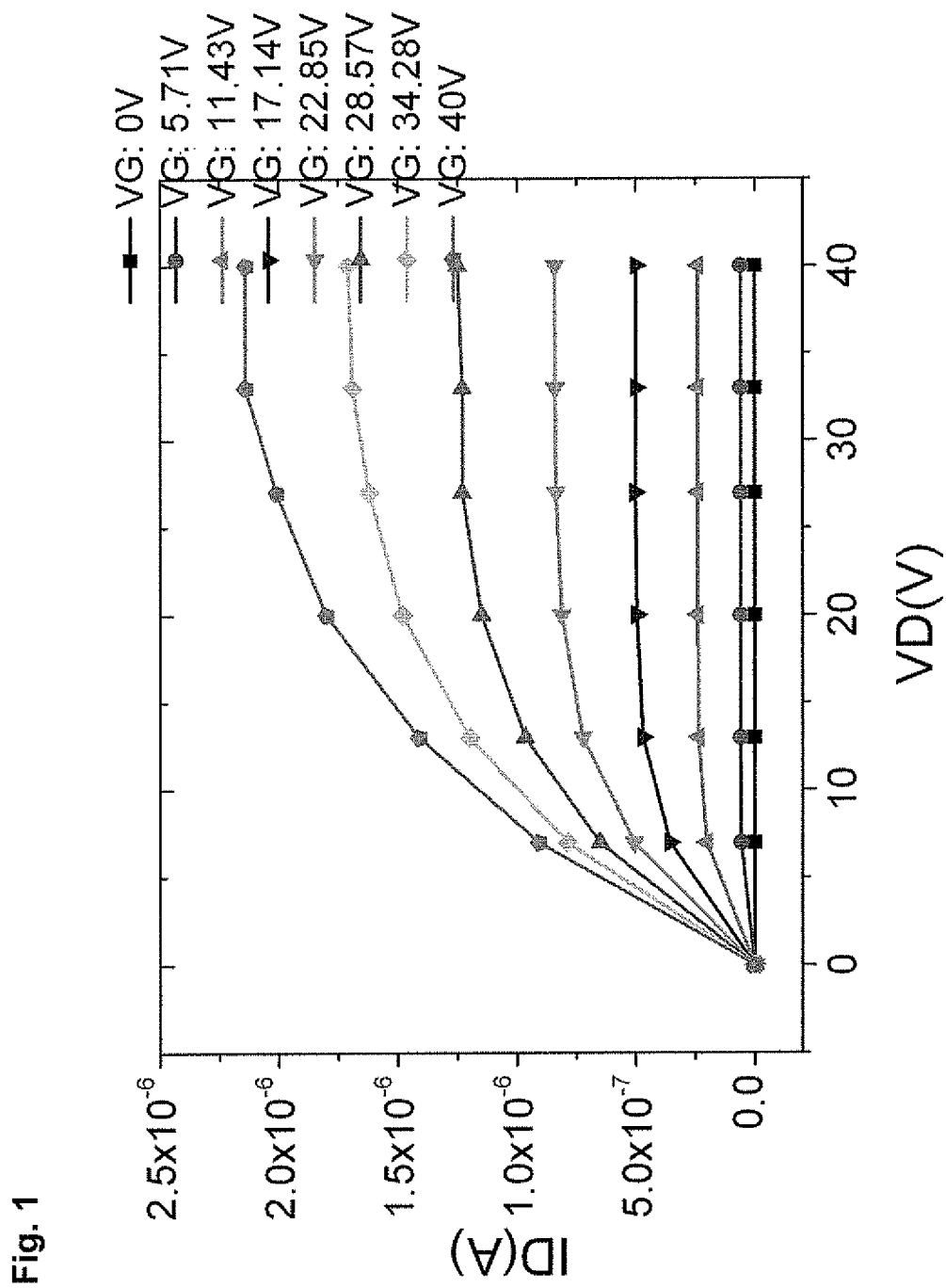

The present invention relates to a process for preparing a solution of electrically uncharged $[(OH)_x(NH_3)_yZn]_z$ where x, y and z are each independently 0.01 to 10, comprising at least the steps of (A) contacting ZnO and/or $Zn(OH)_2$ with ammonia in at least one solvent in order to obtain a solution of electrically uncharged $[(OH)_x(NH_3)_yZn]_z$ where x, y and z are each independently 0.01 to 10 with a concentration c1, (B) removing some solvent from the solution from step (A) in order to obtain a suspension comprising $Zn(OH)_2$, (C) removing solid $Zn(OH)_2$ from the suspension from step (B), and (D) contacting the $Zn(OH)_2$ from step (C) with ammonia in at least one solvent in order to obtain a solution of electrically uncharged $[(OH)_x(NH_3)_yZn]_z$ where x, y and z are each independently 0.01 to 10 with the concentration c2, and to highly concentrated solutions of electrically uncharged $[(OH)_x(NH_3)_yZn]_z$ where x, y and z are each independently 0.01 to 10, to a process for producing a layer comprising at least zinc oxide on a substrate, comprising at least the steps of (E) preparing a solution of electrically uncharged $[(OH)_x(NH_3)_yZn]_z$ where x, y and z are each independently 0.01 to 10 by the former process according to the invention, (F) applying the solution from step (E) to the substrate and (G) thermally treating the substrate from step (F) at a temperature of 20 to 450° C. in order to convert electrically uncharged $[(OH)_x(NH_3)_yZn]_z$ where x, y and z are each independently 0.01 to 10 to zinc oxide.

Processes for producing substrates coated with semiconductive materials, especially with ZnO, are already known to the person skilled in the art.

According to WO 2009/010142 A2, printed electronic components can be obtained by using a printable ink which comprises an organometallic zinc complex as a precursor compound for the semiconductive zinc oxide. In the organometallic zinc complex used, at least one oximate ligand is present. In addition, this zinc complex is free of alkali metals and alkaline earth metals. In the process according to WO 2009/010142, preference is given to using an organometallic zinc complex which has a ligand selected from 2-(methoxyimino)alkanoate, 2-(ethoxyimino)alkanoate or 2-(hydroxyimino)alkanoate.

J. J. Schneider et al., Adv. Mater. 20, 2008, 3383-3387, disclose printed and flexible field-effect transistors with nanoscale zinc oxide as the active semiconductive material. These nanoscale zinc oxide layers are applied with the aid of a precursor solution, the precursor compound used being organic zinc complexes with (2-methoxyimino)pyruvate ligands.

EP 1 993 122 A2 discloses a process for producing a semiconductive zinc oxide layer as a thin-layer transistor using a precursor solution which can be processed at low temperatures. The precursor solution comprises a zinc salt and a complexing reagent. Suitable zinc salts are zinc nitrate, zinc chloride, zinc sulfate or zinc acetate. The complexing reagents used are carboxylic acids or organic amines.

The latter syntheses have the disadvantages that they are firstly costly and inconvenient, and, secondly, the precursor compounds used can be converted to the desired ZnO only at elevated temperatures, and so these processes are incompatible with heat-sensitive substrates.

In addition, there is also a known process for preparing $Zn(OH)_2(NH_3)_x$, which is a suitable precursor compound for the semiconductive ZnO.

S. Meyers et al., J. Am. Chem. Soc., 130 (51), 2008, 17603-17609, disclose aqueous inorganic inks for the production of zinc oxide TFTs at low temperature. The precursor compound used for the semiconductive zinc oxide is $Zn(OH)_2(NH_3)_x$. In a two-stage process, this inorganic zinc complex is obtained by reacting high-purity zinc nitrate (99.998%) with sodium hydroxide solution in aqueous solution, followed by the reaction of the zinc hydroxide thus obtained with ammonia. In order to remove the salts formed in the reaction of zinc nitrate with sodium hydroxide solution, numerous removal and washing steps are needed. The concentration of the complex in the 6.6 M $NH_3$ solution of Meyers et al. is 0.14 M Zn, which corresponds to approx. 0.9% by weight of Zn.

In order to obtain a ZnO layer with a particular thickness, it is necessary with the prior art processes to apply several ZnO layers in succession, since the concentration of the precursor compounds for ZnO in the solutions present is very low, for example only approx. 1 g of Zn/100 g of solution.

It is therefore an object of the present invention to provide a process with which a solution of a precursor compound of ZnO can be prepared in high concentration, which precursor compound, due to its low decomposition temperature, should be compatible with heat-sensitive substrates such as polyethylene naphthalate or polyethylene terephthalate.

It is a further object of the present invention to provide a process for coating a substrate with semiconductive ZnO, wherein a ZnO layer with the desired layer thickness can be obtained within a few steps, if at all possible in one step. The process for coating a substrate with semiconductive ZnO should also lead to correspondingly coated substrates with improved properties.

These objects are achieved by process (1) according to the invention for preparing a solution of electrically uncharged $[(OH)_x(NH_3)_yZn]_z$ where x, y and z are each independently 0.01 to 10, comprising at least the steps of:

(A) contacting ZnO and/or $Zn(OH)_2$ with ammonia in at least one solvent in order to obtain a solution of electrically uncharged $[(OH)_x(NH_3)_yZn]_z$ where x, y and z are each independently 0.01 to 10 with a concentration c1, (B) removing some solvent from the solution from step (A) in order to obtain a suspension comprising $Zn(OH)_2$, (C) removing solid $Zn(OH)_2$ from the suspension from step (B), (D) contacting the $Zn(OH)_2$ from step (C) with ammonia in at least one solvent in order to obtain a solution of electrically uncharged $[(OH)_x(NH_3)_yZn]_z$ where x, y and z are each independently 0.01 to 10 with the concentration c2.

These objects are additionally achieved by process (2) according to the invention for producing a layer comprising at least zinc oxide on a substrate, comprising at least the steps of:

(E) preparing a solution of electrically uncharged $[(OH)_x(NH_3)_yZn]_z$ where x, y and z are each independently 0.01 to 10 by process (1) according to the invention, (F) applying the solution from step (E) to the substrate and (G) thermally treating the substrate from step (F) at a temperature of 20 to 450° C. in order to convert the electrically uncharged $[(OH)_x(NH_3)_yZn]_z$ where x, y and z are each independently 0.01 to 10 to zinc oxide.

Process (1) is described in detail hereinafter:

Step (A):

Step (A) of process (1) according to the invention comprises the contacting of ZnO and/or $Zn(OH)_2$ with ammonia in at least one solvent in order to obtain a solution of electrically uncharged $[(OH)_x(NH_3)_yZn]_z$ where x, y and z are each independently 0.01 to 10 with a concentration c1.

Preferably, in step (A) of the process according to the invention, a suitable reactor is initially charged with solid zinc oxide ZnO or zinc hydroxide $Zn(OH)_2$ or mixtures thereof. The ZnO and/or $Zn(OH)_2$ usable in accordance with the invention can be obtained by all processes known to those skilled in the art. $Zn(OH)_2$ can be obtained, for example, by reacting suitable zinc salts, for example zinc nitrate such as $Zn(NO_3)_2 \cdot 6H_2O$, zinc sulfate $ZnSO_4 \cdot 7H_2O$, zinc chloride $ZnCl_2$, with aqueous alkali metal hydroxide solutions, for example aqueous NaOH solution, KOH solution. A corresponding process is described, for example, in S. Meyers et al., J. Am. Chem. Soc., 130 (51), 2008, 17603-17609.

It is also possible additionally or exclusively to use other $Zn(OH)_2$ precursor compounds in step (A) of the invention, for example selected from the group consisting of zinc alkoxides, zinc amides, zinc alkyls and mixtures, which likewise give rise to particularly reactive $Zn(OH)_2$ after step (C).

The solid zinc oxide and/or zinc hydroxide is/are then treated with a solution of ammonia ($NH_3$) in a suitable solvent. In this case, it is possible to initially charge either solid zinc oxide and/or zinc hydroxide, and to treat them with ammonia ($NH_3$) in a suitable solvent, or to initially charge ammonia ($NH_3$) in a suitable solvent and to add solid zinc oxide and/or zinc hydroxide.

Step (A) of process (1) according to the invention can be performed in all reactors known to those skilled in the art, for example stirred reactors. According to the invention, step (A) can be performed continuously or batchwise.

The solvent is preferably an aqueous solvent, for example an alcoholic aqueous solution or water, more preferably water. Ammonia is present in this preferably aqueous solution in a concentration of 1 to 18 mol/l, preferably 2 to 15 mol/l, more preferably 3 to 12 mol/l, based in each case on the overall solution. In step (A), preference is given to adding a sufficient amount of the ammonia solution to the solid zinc oxide and/or zinc hydroxide that a reaction mixture is obtained in which zinc oxide is present generally with a concentration of 0.01 to 0.33 mol/l, preferably 0.05 to 0.25 mol/l, more preferably 0.1 to 0.2 mol/l. It is optionally also possible to work directly in liquid ammonia.

The reaction mixture thus obtained is then optionally stirred under pressure at a temperature of generally 10 to 120° C., preferably 10 to 60° C., more preferably 20 to 30° C. In general, the suspension is stirred until the desired proportion of the zinc oxide or hydroxide has gone into solution, for example 2 to 72 h, preferably 2 to 24 h. On completion of the reaction, a solution of electrically uncharged $[(OH)_x(NH_3)_yZn]_x$ where x, y and z are each independently 0.01 to 10 in the solvent, especially water, is present. To remove any suspended substances present, the solution obtained can optionally be purified, for example by filtration.

In the electrically uncharged compound $[(OH)_x(NH_3)_yZn]_z$ prepared in step (A) of the process according to the invention, x, y and z are generally each independently 0.01 to 10, preferably each independently 1 to 6. Preferably, z=1. Additionally preferably, x=2. Additionally preferably, y=2 or 4.

For example, x=2 and y=2 or y=4 and z=1, and so particular preference is given to preparing, in step (A) of the process according to the invention, a solution of $[Zn(NH_3)_2](OH)_2$ or $[Zn(NH_3)_4](OH)_2$. According to the invention, x, y and z may each independently be either integers or fractions.

The present invention therefore preferably relates to the process according to the invention wherein x, y, and z are each independently 1 to 6.

The electrically uncharged $[(OH)_x(NH_3)_yZn]_z$ where x, y and z are each independently 0.01 to 10, which is present in the solution and is prepared with preference in step (A) of process (1) according to the invention, is notable in that it preferably does not comprise any impurities, for example extraneous ions such as $Na^+$, $K^+$, $NO_3^-$ etc., which originate from the reactants used for the preparation, extremely inexpensive reactants can be used and no purification steps are needed. The product obtained with preference preferably has a particularly high purity directly after the preparation without any further purification steps, for example of >99%, preferably of >99.5%, more preferably of >99.9%.

After step (A) of process (1) according to the invention, a solution is obtained which comprises electrically uncharged $[(OH)_x(NH_3)_yZn]_z$ where x, y and z are each independently 0.01 to 10 in a solvent, preferably in water. In addition to these components, the solution obtained in step (A) may optionally comprise further additives which serve, for example, to improve any deposition operation on to a substrate, if the solution prepared by the process according to the invention is used, for example, to produce a layer of ZnO on a substrate, for example by process (2) according to the invention. These additives can be introduced separately into the solution in step (A). However, it is not preferred in accordance with the invention to add corresponding additives in step (A). When corresponding additives are added in accordance with the invention this is preferably done in step (D) of the process according to the invention.

The solution prepared in step (A) of process (1) according to the invention comprises electrically uncharged $[(OH)_x(NH_3)_yZn]_z$ where x, y and z are each independently 0.01 to 10 in a concentration c1.

The concentration c1 is generally 0.1 to 2.2 g of Zn/100 g of solution, preferably 0.3 to 1.5 g of Zn/100 g of solution, more preferably 0.7 to 1.3 g of Zn/100 g of solution. A typical concentration c1 is 1 g of Zn/100 g of solution.

The solution prepared in step (A) of process (1) according to the invention may additionally also comprise further metal cations which serve to dope the ZnO optionally obtained. In one embodiment, these metal cations are selected from the group consisting of $Al^{3+}$, $In^{3+}$, $Sn^{4+}$, $Ga^{3+}$ and mixtures thereof. These metal cations can be introduced separately into the solution in step (A). However, it is not preferred in accordance with the invention to add corresponding metal cations in step (A). When corresponding metal cations are added for doping in accordance with the invention, this is preferably done in step (D) of the process according to the invention.

To prepare the solution in step (A), the dopant metal cations mentioned can be added in the form of metal oxides, metal hydroxides, metal alkoxides, or in the form of soluble complexes. The dopants mentioned can be added to the solution in step (A) of the process according to the invention generally in an amount of 0.02 to 10 mol % based on Zn, preferably of 0.1 to 5 mol % based on Zn.

The present invention therefore also relates to process (1) according to the invention wherein the solution prepared comprises metal cations selected from the group consisting of $Al^{3+}$, $In^{3+}$, $Sn^{4+}$, $Ga^{3+}$ and mixtures thereof.

Step (B):

Step (B) of process (1) according to the invention comprises the partial removal of solvent from the solution from step (A) in order to obtain a suspension comprising $Zn(OH)_2$.

In step (B) of the process according to the invention, the present solvent, especially water, is partially removed by methods known to those skilled in the art, for example under elevated pressure and/or reduced pressure. In step (B) of the process according to the invention, it is also optionally possible to at least partially remove ligands such as $NH_3$.

The present invention therefore preferably relates to process (1) according to the invention wherein the solvent is partially removed in step (B) under elevated temperature and/or elevated pressure.

According to the invention, "elevated temperature" is understood to mean a temperature which is above room temperature, for example 30 to 100° C., preferably 30 to 90° C., more preferably 40 to 80° C. According to the invention, "reduced pressure" is understood to mean a pressure which is below atmospheric pressure, for example less than 1000 mbar (a), preferably 10 to 900 mbar (a), more preferably 100 to 800 mbar (a).

As a result of the elevated temperature and/or the reduced pressure, the solvent and $NH_3$ evaporate and can thus be removed from the solution. The partial removal of the solvent in step (B) of the process according to the invention is effected preferably in a distillation apparatus or a rotary evaporator. These apparatuses are known to those skilled in the art.

According to the invention, "partial removal" is understood to mean that the present solvent is not removed completely but only partially; for example 20 to 90% by weight, preferably 30 to 80% by weight, more preferably 40 to 70% by weight, for example 50% by weight, of the solvent used in step (A) is removed in step (B).

In step (B) of process (1) according to the invention, generally not only a portion of the solvent is removed, but also ammonia present in solution or in the $[(OH)_x(NH_3)_yZn]_z$ complex formed where x, y and z are each independently 0.01 to 10. Therefore, the complex mentioned forms, in step (B), a solid which comprises $Zn(OH)_2$, optionally in combination with ZnO.

After step (B) of process (1) according to the invention, a suspension of $Zn(OH)_2$ in a solvent, preferably water, is therefore obtained.

Step (C):

Step (C) of process (1) according to the invention comprises the removal of solid $Zn(OH)_2$ from the suspension from step (B).

Step (C) of process (1) according to the invention can generally be effected by all processes known to those skilled in the art, for example filtration, decantation, centrifugation, more preferably filtration.

The filtration process is known per se to those skilled in the art, for example using paper filters or mineral filters, for example composed of $SiO_2$.

After step (C) of the process according to the invention, solid $Zn(OH)_2$ and solvent, preferably water, are obtained separately from one another.

In a preferred embodiment, the $Zn(OH)_2$ obtained is dried after the removal, for example under elevated temperature and/or reduced pressure. Particular preference is given to drying in step (C) at a temperature of 20 to 30° C. and a pressure below atmospheric pressure, for example at 20 to 800 mbar (a).

Step (D):

Step (D) of process (1) according to the invention comprises the contacting of the $Zn(OH)_2$ from step (C) with ammonia in at least one solvent, in order to obtain a solution of electrically uncharged $[(OH)_x(NH_3)_yZn]_z$ where x, y and z are each independently 0.01 to 10 with the concentration c2.

Step (D) of process (1) according to the invention can be performed in all reactors known to those skilled in the art, for example stirred reactors. According to the invention, step (D) can be performed continuously or batchwise.

The solvent is preferably an aqueous solvent, for example an alcoholic aqueous solution or water, more preferably water.

In a particularly preferred embodiment, in steps (A) and (D) of the process according to the invention, ammonia is used in aqueous solution in each case, preferably in water.

The present invention therefore preferably relates to the process according to the invention wherein the solvent in steps (A) and (D) is an aqueous solution or water.

Ammonia is present in the aqueous solution used with preference in step (D) in a concentration of 1 to 18 mol/l, preferably 2 to 15 mol/l, more preferably 3 to 12 mol/l, based in each case on the overall solution.

It is also possible in accordance with the invention that an aqueous ammonia solution which has a higher or lower concentration than the aqueous ammonia solution used in step (A) is used in step (D). For example, in step (D), an aqueous ammonia solution is used which has an ammonia content of 15 to 35% by weight, preferably 20 to 30% by weight, for example 25% by weight.

Preferably, in step (D), a sufficient amount of the ammonia solution is added to the solid zinc hydroxide $Zn(OH)_2$ that a reaction mixture is obtained in which zinc hydroxide is present generally with a concentration of 0.1 to 1 mol/L, preferably 0.25 to 0.75 mol/L, more preferably 0.33 to 0.6 mol/L. It is optionally also possible to work directly in liquid ammonia.

The reaction mixture thus obtained is then stirred at a temperature of generally 10 to 120° C., preferably 10 to 60° C., more preferably 20 to 30° C. In general, the suspension is stirred until the desired conversion is obtained, for example for 2 to 72 h, preferably 2 to 24 h.

After the reaction in step (D) of process (1) according to the invention, a solution of electrically uncharged $[(OH)_x(NH_3)_yZn]_z$ where x, y and z are each independently 0.01 to 10 in the solvent, especially water, is present. To remove any suspended substances present, the solution obtained can optionally be purified, for example by filtration.

In the electrically uncharged compound $[(OH)_x(NH_3)_yZn]_z$ prepared in step (D) of the process according to the invention, x, y, and z are generally each independently 0.01 to 10, preferably each independently 1 to 6. Preferably, z=1. Additionally preferably, x=2. Additionally preferably, y=2 or 4.

For example, x=2 and y=2 or y=4 and z=1, such that, in step (D) of the process according to the invention, particular preference is given to preparing a solution of $[Zn(NH_3)_2](OH)_2$ or $[Zn(NH_3)_4](OH)_2$. According to the invention, x, y and z may each independently be either integers or fractions.

The additives or dopant metals mentioned with regard to step (A) can also or exclusively be added in step (D). Preferably, the dopant metals mentioned are added exclusively in step (D) and not in step (A).

The solution obtained in step (D) of process (1) according to the invention comprises electrically uncharged $[(OH)_x(NH_3)_yZn]_z$ where x, y and z are each independently 0.01 to 10 in a concentration c2.

In a preferred embodiment of process (1) according to the invention, concentration c2 is greater than concentration c1.

Therefore, the present invention preferably relates to the process according to the invention wherein concentration c2 is greater than concentration c1.

Concentration c2 is generally 0.6 to 6.5 g of Zn/100 g of solution, preferably 1.6 to 5 g of Zn/100 g of solution, more preferably 2.2 to 3.9 g of Zn/100 g of solution, for example 3.0 g of Zn/100 g of solution.

The present invention also relates to a solution of electrically uncharged $[(OH)_x(NH_3)_yZn]_z$ where x, y and z are each independently 0.01 to 10 in a solvent, preferably water, preparable, preferably prepared, by process (1) according to the invention. In this inventive solution, the electrically uncharged $[(OH)_x(NH_3)_yZn]_z$ where x, y and z are each independently 0.01 to 10 is present in a concentration of generally 0.6 to 6.5 g of Zn/100 g of solution, preferably 1.6 to 5.0 g of Zn/100 g of solution, more preferably 2.2 to 3.9 g of Zn/100 g of solution, for example 3.0 g of Zn/100 g of solution.

The present invention also relates to a solution of electrically uncharged $[(OH)_x(NH_3)_yZn]_z$ where x, y and z are each independently 0.01 to 10 in a solvent, preferably water, in a concentration of 1.6 to 5.0 g of Zn/100 g of solution, preferably 2.2 to 3.9 g of Zn/100 g of solution, for example 3.0 g of Zn/100 g of solution.

With regard to the electrically uncharged compound $[(OH)_x(NH_3)_yZn]_z$ where x, y and z are each independently 0.01 to 10 and the preferred solvents, the statements for process (1) apply. The inventive solution is preferably prepared by process (1) according to the invention.

In a preferred embodiment, the solution of electrically uncharged $[(OH)_x(NH_3)_yZn]_z$ where x, y and z are each independently 0.01 to 10 in a concentration c2 obtained in step (D) of process (1) according to the invention can be used directly for coating of substrates in order to form a layer of ZnO on these substrates. In a preferred embodiment, this can be accomplished by process (2) according to the invention comprising at least steps (E), (F) and (G).

By process (1) according to the invention, it is possible to obtain a solution of electrically uncharged $[(OH)_x(NH_3)_yZn]_z$ where x, y and z are each independently 0.01 to 10 in a particularly high concentration. Therefore, the solution preparable in accordance with the invention can, for example, be used particularly advantageously for the coating of substrates, since a large amount of the corresponding compound can be applied to the substrate in one step, such that a ZnO layer with high layer thickness can be obtained in the subsequent thermal treatment and the associated conversion of electrically uncharged $[(OH)_x(NH_3)_yZn]_z$ where x, y and z are each independently 0.01 to 10 to semiconductive ZnO. The solutions of precursor compounds for semiconductive materials obtainable by the prior art comprise corresponding precursor compounds only in low concentrations, such that several steps are needed in corresponding coating processes in order to achieve a desired layer thickness.

The high concentration c2 in accordance with the invention can be achieved by the inventive combination of steps (B) to (D). The partial removal of the solvent makes it possible to obtain a particularly reactive $Zn(OH)_2$, which can be converted in the subsequent step (D) in a greater proportion to the soluble electrically uncharged complex $[(OH)_x(NH_3)_yZn]_z$ where x, y and z are each independently 0.01 to 10 than is possible with $Zn(OH)_2$ in accordance with the prior art.

The present invention also relates to process (2) according to the invention for producing a layer comprising at least zinc oxide on a substrate, comprising at least the steps of:
(E) preparing a solution of electrically uncharged $[(OH)_x(NH_3)_yZn]_z$ where x, y and z are each independently 0.01 to 10 by process (1) according to the invention,
(F) applying the solution from step (E) to the substrate and
(G) thermally treating the substrate from step (F) at a temperature of 20 to 450° C. in order to convert electrically uncharged $[(OH)_x(NH_3)_yZn]_z$ where x, y and z are each independently 0.01 to 10 to zinc oxide.

Process (2) according to the invention serves to produce a layer comprising at least zinc oxide on a substrate.

In general, it is possible by process (2) according to the invention to coat all substrates known to those skilled in the art, for example silicon wafers, glass, ceramics, metals, metal oxides, semimetal oxides, polymers such as polyethylene terephthalate (PET), polyethylene naphthalate (PEN), polycarbonates, polyacrylates, polystyrenes, polysulfones, etc.

In a preferred embodiment of process (2) according to the invention, the substrate is mechanically flexible and comprises at least one polymer, for example selected from the group consisting of polyesters, for example polyethylene terephthalate (PET), polyethylene naphthalate (PEN), polyimides, polycarbonates, polysulfones and mixtures thereof.

The present invention therefore preferably relates to the process according to the invention wherein the substrate is mechanically flexible and comprises at least one polymer.

The layer which comprises at least one semiconductive metal oxide and is produced on the substrate by the process according to the invention generally has a thickness of 5 to 250 nm, preferably 5 to 100 nm.

The individual steps of process (2) according to the invention are described in detail hereinafter:

Step (E):

Step (E) of the process according to the invention comprises the preparation of a solution of electrically uncharged $[(OH)_x(NH_3)_yZn]_z$ where x, y and z are each independently 0.01 to 10 by process (1) according to the invention.

Step (E) of process (2) according to the invention comprises at least steps (A), (B), (C) and (D) of process (1) according to the invention. Therefore, the statements made with regard to steps (A), (B), (C) and (D) apply to step (E).

The present invention therefore relates, in one embodiment, also preferably to the process according to the invention wherein the ZnO is doped with metal cations selected from the group consisting of $Al^{3+}$, $In^{3+}$, $Sn^{4+}$, $Ga^{3+}$ and mixtures thereof.

The present invention therefore relates, in a preferred embodiment, to process (2) according to the invention for producing a layer comprising at least zinc oxide on a substrate, comprising at least the steps of:
(A) contacting ZnO and/or $Zn(OH)_2$ with ammonia in at least one solvent in order to obtain a solution of electrically uncharged $[(OH)_x(NH_3)_yZn]_z$ where x, y and z are each independently 0.01 to 10 with a concentration c1,
(B) removing some solvent from the solution from step (A) in order to obtain a suspension comprising $Zn(OH)_2$,
(C) removing solid $Zn(OH)_2$ from the suspension from step (B),
(D) contacting the $Zn(OH)_2$ from step (C) with ammonia in at least one solvent in order to obtain a solution of electrically uncharged $[(OH)_x(NH_3)_yZn]_z$ where x, y and z are each independently 0.01 to 10 with the concentration c2,
(F) applying the solution from step (D) to the substrate and
(G) thermally treating the substrate from step (F) at a temperature of 20 to 450° C. in order to convert electrically uncharged $[(OH)_x(NH_3)_yZn]_z$ where x, y and z are each independently 0.01 to 10 to zinc oxide.

In a preferred embodiment, the solution obtained after step (D) is used directly in step (F) of the invention.

Step (F):

Step (F) of process (2) according to the invention comprises the application of the solution from step (E) or (D) to the substrate.

In general, step (F) can be performed by all methods known to those skilled in the art which are suitable for applying the solution obtained from step (E) or (D) to the substrate, for example spin-coating, spray-coating, dip-coating, drop-casting or printing, for example inkjet printing, flexographic printing or gravure printing.

The present invention therefore relates, in a preferred embodiment, to the process according to the invention wherein the solution from step (E) or (D) is applied in step (F) by spin-coating, spray-coating, dip-coating, drop-casting and/or printing.

More preferably, the solution from step (E) or (D) is applied in step (F) of the process according to the invention by spin-coating or inkjet printing. These processes are known per se to those skilled in the art.

The present invention therefore also relates to the process according to the invention wherein the solution from step (E) or (D) is applied in step (F) by spin-coating.

In step (F), preference is given to applying a solution of an appropriate concentration to the substrate such that the thermal treatment in step (G) gives a ZnO layer with the desired layer thickness.

Step (G):

Step (G) of process (2) according to the invention comprises the thermal treatment of the substrate from step (F) at a temperature of 20 to 450° C. in order to convert electrically uncharged $[(OH)_x(NH_3)_yZn]_z$ where x, y and z are each independently 0.01 to 10 to zinc oxide. In a preferred embodiment, the temperature in step (G) of the process according to the invention is less than 200° C.

In general, step (G) can be performed in all apparatuses known to those skilled in the art for heating substrates, for example a hotplate, an oven, a drying cabinet, a hot air gun, a belt calciner or a climate-controlled cabinet with or without a heating ramp.

When step (G) of the process according to the invention is performed at a relatively low temperature of, for example, 20 to 50° C., the decomposition to zinc oxides is effected preferably by means of catalytic activation, for example by contacting with reactive gas flow or by irradiation. A catalytic activation is also possible at higher temperatures, but is not preferred.

In step (G), electrically uncharged $[(OH)_x(NH_3)_yZn]_z$ where x, y and z are each independently 0.01 to 10, which has been applied with the solution from step (E) in step (F), is converted to zinc oxide.

According to the invention, it is advantageous that the electrically uncharged $[(OH)_x(NH_3)_yZn]_z$ where x, y and z are each independently 0.01 to 10 can be converted to zinc oxide preferably at a temperature below 200° C., more preferably below 150° C., even more preferably below 130° C., especially below 100° C., such that it is possible to use, for example, polymer substrates which are not deformed or thermally degraded during the preparation of zinc oxide. A further advantage is that, due to the electrically uncharged $[(OH)_x(NH_3)_yZn]_z$ where x, y and z are each independently 0.01 to 10 used in the thermal treatment in step (G) of the process according to the invention, only volatile by-products are formed, which thus escape in gaseous form and do not remain as troublesome impurities in the layer formed.

A further advantage of process (2) according to the invention is that the elevated concentration of electrically uncharged $[(OH)_x(NH_3)_yZn]_z$ where x, y and z are each independently 0.01 to 10 in the solution from step (E) or (D) allows a sufficient amount of electrically uncharged $[(OH)_x(NH_3)_yZn]_z$ where x, y and z are each independently 0.01 to 10 to be applied to the substrate in a few steps, preferably in one step, that a sufficient layer thickness of ZnO can be obtained.

The electrically uncharged $[(OH)_x(NH_3)_yZn]_z$ where x, y and z are each independently 0.01 to 10 used in accordance with the invention is generally converted in step (G) to zinc oxide and volatile compounds, or mixtures thereof. More particularly, after the thermal treatment in step (G), no by-products of the precursor compounds remain in the zinc oxide layer formed, for example counterions such as halide ions, nitrate ions, cations such as $Na^+$, $K^+$, or uncharged ligands. A further advantage of the electrically uncharged $[(OH)_x(NH_3)_yZn]_z$ where x, y and z are each independently 0.01 to 10 used in accordance with the invention is that it can generally be converted to the corresponding metal oxide in step (G) of the process according to the invention without addition of further additives, since it already has the oxygen needed for the conversion to the corresponding oxides in the ligand sphere. Since no further additives need be added, no by-products of these additives remain in the layer formed. It is likewise advantageous that steps (E), (F) and (G) of the production process can be performed under ambient conditions (atmospheric oxygen, etc.).

The present invention also relates to a layer comprising at least zinc oxide on a substrate, producible, preferably produced, by the process according to the invention.

With regard to the layer thickness, possible additives, doping elements, substrates and further details of the inventive layer, the statements made above apply.

FIGURES

Figure 2:
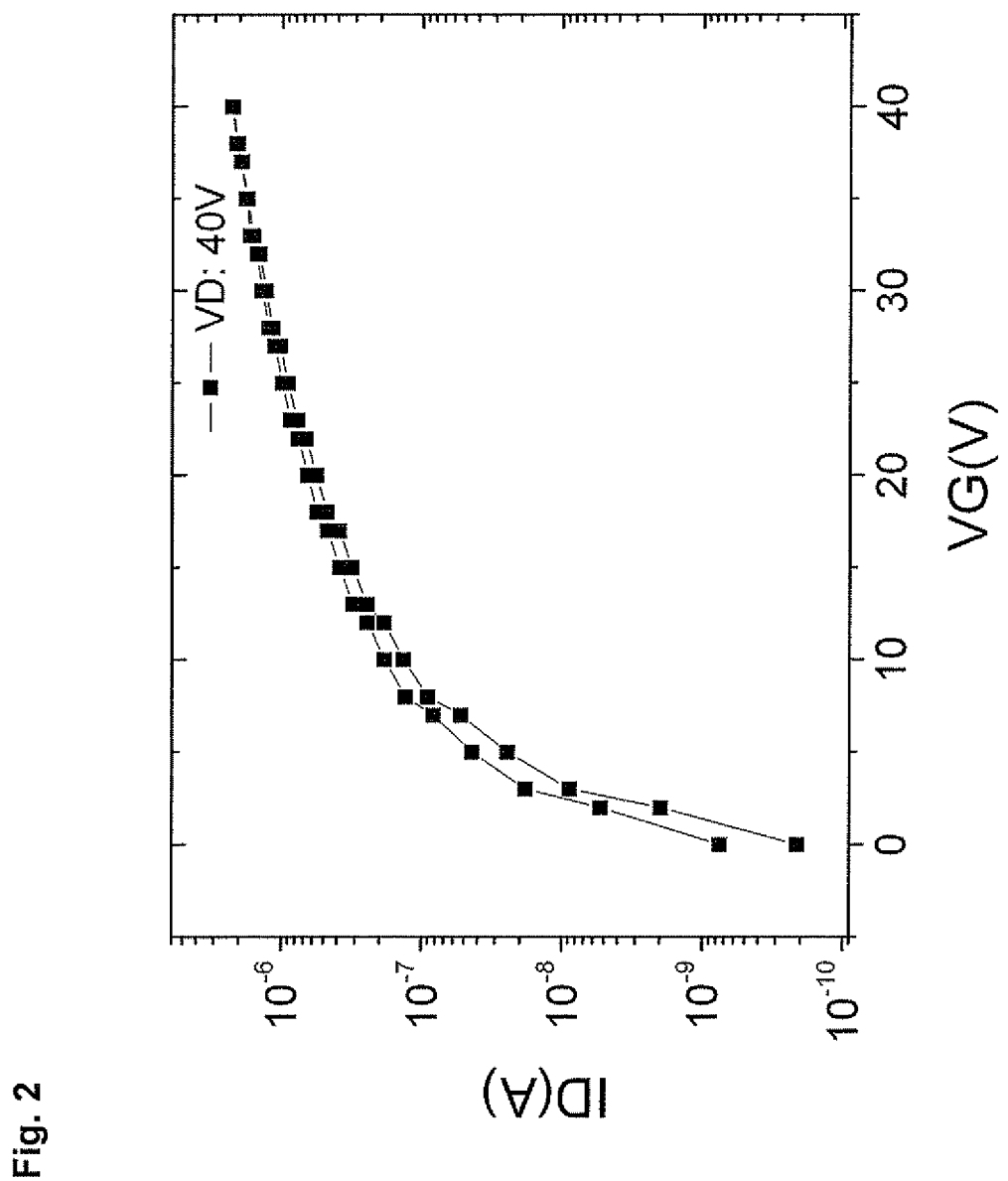

FIG. 1 shows a representative output curve (OC) of a field-effect transistor according to example 3. In this figure:
VD voltage between source and drain
ID current between source and drain FIG. 2 shows a representative transfer curve (TC) of a field-effect transistor according to example 3. In this figure:
VG voltage between source and gate
ID current between source and drain

EXAMPLES

Example 1

Preparation of a Highly Concentrated Solution of $Zn(OH)_2(NH_3)_4$

Feedstocks:
12.2 g of ZnO (Umicore Pharma)
500 g of 25% aqueous $NH_3$ solution
511 g of demineralized water
200 g of 25% aqueous $NH_3$ solution Procedure:

Step 1:

First, an approx. 7 molar $NH_3$ solution is prepared from 500 g of 25% $NH_3$ solution and 511 g of water. The ZnO is initially charged in a 1000 ml Duran glass bottle, then 1000 ml of $NH_3$ solution prepared are added and everything is stirred on a magnetic stirrer overnight. This forms a colorless clear solution of $Zn(OH)_2(NH_3)_4$, the concentration of which is 1 g of Zn/100 g of solution. The concentration is determined by elemental analysis by means of atomic emission spectroscopy.

Step 2:

This solution is concentrated on a rotary evaporator to a volume of approx. 500 ml, which forms a white suspension. The suspension is filtered with suction through a P4 suction filter, and the white powder obtained is dried at room temperature and 500 mbar in a vacuum drying cabinet overnight. The dried powder is initially charged in a 250 ml Duran glass bottle and 200 g of $NH_3$ (25% solution) are added, and the mixture is again stirred overnight. The solids still present are allowed to settle. A sample is taken from the clear supernatant solution, forced through a Milipore filter and analyzed.

The solution of the $Zn(OH)_x(NH_3)_y$ complex has a Zn content of 3.0 g of Zn/100 g of solution, determined by elemental analysis by means of atomic emission spectroscopy.

Example 2

Production of a ZnO Layer Using the Solution from Example 1

An aqueous $Zn(OH)_2(NH_3)_4$ solution with a concentration of 1 g of Zn/100 g of solution, prepared according to example 1, step 1, is applied to a cleaned silicon wafer with a silicon dioxide layer by spin-coating (3000 rps, 30 s), and heated on a hot plate at 150° C. for 1 h. The layer thickness obtained is 12 nm (determined by means of atomic force microscopy).

An aqueous $Zn(OH)_2(NH_3)_4$ solution with a concentration of 3 g of Zn/100 g of solution, prepared according to example 1, step 2, is applied to a cleaned silicon wafer with a silicon dioxide layer by spin-coating (3000 rps, 30 s), and heated on a hot plate at 150° C. for 1 h. The layer thickness obtained is 40 nm (determined by means of atomic force microscopy).

Example 3

Production of a ZnO Field-Effect Transistor on Polyethylene Naphthalate (PEN) film substrate comprising a ZnO semi conducting-material processed from solution (example 1) and silsesquioxane dielectric processed from solution.

A 25% by weight solution of GR 150 glass resin (Techneglass, Inc.) consisting of methyl- and phenylsilsesquioxane units in ethyl lactate is spun (60 s, 3000 rpm) on to a cleaned PEN film substrate (Teonex, DuPont Teijin Films) with a 75 nm aluminum gate (applied by thermal vapor deposition), and then heated at 80° C. for 1 minute and at 150° C. for 1 hour. After oxygen plasma treatment (30 s), the aqueous $Zn(OH)_2(NH_3)_4$ solution with a concentration of 3 g of Zn/100 g of solution, prepared according to example 1, step 2, is spun on (30 s, 3000 rpm) and heated at 150° C. for 1 h (heating ramp for 30 minutes). Source/drain contacts (channel width/length ratio: 20) are obtained by thermal vapor deposition of aluminum. The following average parameters are determined:

Mobility $\mu$: $7*10^{-2} cm^2/(V*s)$
On/off ratio: $10^4$,
$V_T$ threshold voltage: 1 V

Example 4

Production of a Highly Concentrated Solution of $Zn(OH)_2(NH_3)_4$

Feedstocks:
12.2 g of ZnO (Umicore Pharma),
600 g of 25% aqueous $NH_3$ solution,
613.4 g of demineralized water
Procedure:
Step 1:
First, an approx. 7 molar $NH_3$ solution is prepared from 600 g of 25% $NH_3$ solution and 613.4 g of water. The ZnO is initially charged in a 1000 ml Duran glass bottle, then 1000 ml of $NH_3$ solution prepared are added and everything is stirred on a magnetic stirrer overnight. This forms a colorless clear solution of $Zn(OH)_2(NH_3)_4$, the concentration of which is 1.0 g of Zn/100 g of solution. The concentration is determined by elemental analysis by means of atomic emission spectroscopy.
Step 2:
This solution is concentrated on a rotary evaporator to a volume of approx. 500 ml, which forms a white suspension. The suspension is filtered with suction through a P4 suction filter, and the white powder obtained is dried at room temperature and 500 mbar in a vacuum drying cabinet overnight. The dried powder is initially charged in a 250 ml Duran glass bottle and 200 ml of the approx. 7 molar $NH_3$ solution are added, and the mixture is again stirred overnight. The clear solution is forced through a Milipore filter and analyzed. The solution of the $Zn(OH)_x(NH_3)_y$ complex has a Zn content of 2.9 g of Zn/100 g of solution, determined by elemental analysis by means of atomic emission spectroscopy.

Example 4 shows that a highly concentrated solution is also obtained when an approx. 7 molar $NH_3$ solution is used in step (D) of the process according to the invention.

Example 5

Preparation of a Highly Concentrated Solution of $Zn(OH)_2(NH_3)_4$

Feedstocks:
12.2 g of ZnO (Sigma Aldrich, 99.99% of ZnO)
500 g of 25% aqueous $NH_3$ solution
511 g of demineralized water
200 g of 25% aqueous $NH_3$ solution
Procedure:
Step 1:
First, an approx. 7 molar $NH_3$ solution is prepared from 500 g of 25% $NH_3$ solution and 511 g of water. The ZnO is initially charged in a 1000 ml Duran glass bottle, then 1000 ml of $NH_3$ solution prepared are added and everything is stirred on a magnetic stirrer overnight. This forms a colorless clear solution of $Zn(OH)_2(NH_3)_4$, the concentration of which is 0.94 g of Zn/100 g of solution. The concentration is determined by elemental analysis by means of atomic emission spectroscopy.
Step 2:
This solution is concentrated on a rotary evaporator to a volume of approx. 500 ml, which forms a white suspension. The suspension is filtered with suction through a P4 suction filter, and the white powder obtained is dried at room temperature and 500 mbar in a vacuum drying cabinet overnight. The dried powder is initially charged in a 250 ml Duran glass bottle and 200 g of $NH_3$ (25% solution) are added, and the mixture is again stirred overnight. The solids still present are allowed to settle. A sample is taken from the clear supernatant solution, forced through a Milipore filter and analyzed.

The solution of the $Zn(OH)_x(NH_3)_y$ complex has a Zn content of 2.9 g of Zn/100 g of solution, determined by elemental analysis by means of atomic emission spectroscopy.

Example 5 shows that a highly concentrated solution is also obtained when ZnO from a different source is used in step (A) of the process according to the invention.

Comparative Example 1

Preparation of a Solution of $Zn(OH)_2(NH_3)_4$

Feedstocks:
12.2 g of ZnO (Umicore Pharma)
500 g of 25% aqueous $NH_3$ solution
511 g of demineralized water
Procedure:
An approx. 7 molar $NH_3$ solution is prepared from 500 g of 25% $NH_3$ solution and 511 g of water. 12.2 g of ZnO are initially charged in a 1000 ml Duran glass bottle, then 1000 ml of the $NH_3$ solution prepared are added and everything is stirred on a magnetic stirrer overnight. This forms a colorless clear solution of $Zn(OH)_2(NH_3)_4$, the concentration of which is 0.99 g of Zn/100 g of solution, determined by elemental analysis by means of atomic emission spectroscopy.

Comparative example 1 shows that, in the case of direct dissolution of ZnO with aqueous $NH_3$ solution, only a solution with low concentration of the zinc complex is obtained.

Comparative Example 2

Preparation of a solution of $Zn(OH)_2(NH_3)_4$

Feedstock:
10 g of ZnO (Umicore Pharma)
180 ml of 25% aqueous $NH_3$ solution
Procedure:

The 25% aqueous $NH_3$ solution and 10 g of ZnO are introduced into an autoclave. This mixture is stirred in an autoclave at a temperature of 80° C. and a pressure of 20 bar for 16 h. After cooling, the solids still present are allowed to settle. A sample is taken from the clear supernatant solution, forced through a Milipore filter and analyzed. The solution of the $Zn(OH)_x(NH_3)_y$ complex has a Zn content of only 1.0 g of Zn/100 g of solution, determined by elemental analysis by means of atomic emission spectroscopy.

Comparative example 2 shows that, even under more severe pressure and temperature conditions, only a solution with a low concentration of the zinc complex is obtained.

The invention claimed is:

1. A process for preparing a solution of electrically uncharged $[(OH)_x(NH_3)_yZn]_z$ where x, y and z are each independently 0.01 to 10, the process comprising:
   (A) contacting ZnO, $Zn(OH)_2$, or both, with ammonia in at least one solvent, to obtain a first solution, having a concentration c1, of electrically uncharged $[(OH)_x(NH_3)_yZn]_z$ where x, y and z are each independently 0.01 to 10,
   (B) removing some of the solvent from the solution obtained in (A), to obtain a suspension comprising $Zn(OH)_2$,
   (C) removing solid $Zn(OH)_2$ from the suspension obtained in (B),
   (D) contacting the $Zn(OH)_2$ from (C) with ammonia in at least one solvent, to obtain a second solution, having a concentration c2, of electrically uncharged $[(OH)_x(NH_3)_yZn]_z$ where x, y and z are each independently 0.01 to 10.

2. The process of claim 1, wherein concentration c2 is greater than concentration c1.

3. The process of claim 1, wherein x, y and z are each independently 1 to 6.

4. The process of claim 1, wherein the solvent in (A) and (D) is an aqueous solution or water.

5. The process of claim 1, wherein the solvent is removed in (B) under elevated temperature, reduced pressure, or both.

6. A solution of electrically uncharged $[(OH)_x(NH_3)_yZn]_z$ where x, y and z are each independently 0.01 to 10, obtained by the process of claim 1.

7. A solution of electrically uncharged $[(OH)_x(NH_3)_yZn]_z$ where x, y and z are each independently 0.01 to 10 in a solvent, in a concentration of 1.6 to 5.0 g of Zn/100 g of solution.

8. A process for producing a layer comprising zinc oxide on a substrate, the process comprising:
   (E) preparing a solution of electrically uncharged $[(OH)_x(NH_3)_yZn]_z$ where x, y and z are each independently 0.01 to 10 by the process of claim 1,
   (F) contacting the solution from (E) with the substrate, and
   (G) thermally treating the substrate from (F) at a temperature of 20 to 450° C. to convert $[(OH)_x(NH_3)_yZn]_z$ where x, y and z are each independently 0.01 to 10 to zinc oxide.

9. The process of claim 8, wherein the substrate is mechanically flexible and comprises a polymer.

10. The process of claim 8, wherein the zinc oxide is doped with at least one metal cation selected from the group consisting of $Al^{3+}$, $In^{3+}$, $Sn^{4+}$, and $Ga^{3+}$.

11. The process of claim 8, wherein the contacting (F) is performed by at least one operation selected from the group consisting of spin-coating, spray-coating, dip-coating, drop-casting and printing.

12. The process of claim 8, wherein the temperature in (G) is less than 200° C.

13. The process of claim 1, wherein z is 1.

14. The process of claim 1, wherein x is 2.

15. The process of claim 1, wherein y is 2 or 4.

16. The process of claim 1, wherein x is 2, y is 2 or 4, and z is 1.

17. The process of claim 1, wherein the concentration c1 is 0.1 to 2.2 g of Zn/100 g of solution.

18. The process of claim 1, wherein the concentration c2 is 0.6 to 6.5 g of Zn/100 g of solution.

19. The process of claim 1, wherein the solvent in (A) and (D) is water.

20. The solution of claim 6, wherein the electrically uncharged $[(OH)_x(NH_3)_yZn]_z$ has a concentration of 1.6 to 5.0 g of Zn/100 g of solution.

* * * * *